US008144900B2

(12) United States Patent
Oxford et al.

(10) Patent No.: US 8,144,900 B2
(45) Date of Patent: Mar. 27, 2012

(54) SPEAKER SYSTEM

(76) Inventors: J. Craig Oxford, Nashville, TN (US); D. Michael Shields, St. Paul, MN (US)

( * ) Notice: Subject to any disclaimer, the term of this patent is extended or adjusted under 35 U.S.C. 154(b) by 1523 days.

(21) Appl. No.: 11/324,629

(22) Filed: Jan. 3, 2006

(65) Prior Publication Data

US 2006/0151237 A1 Jul. 13, 2006

Related U.S. Application Data

(63) Continuation-in-part of application No. 10/418,666, filed on Aug. 4, 2003, now abandoned, which is a continuation-in-part of application No. 09/478,319, filed on Jan. 6, 2000, now Pat. No. 6,628,793.

(51) Int. Cl.

| | |
|---|---|
| ***H04R 5/02*** | (2006.01) |
| ***H04R 9/06*** | (2006.01) |
| ***H04R 1/20*** | (2006.01) |
| ***H04B 3/00*** | (2006.01) |
| ***H05K 5/00*** | (2006.01) |

(52) U.S. Cl. .......... 381/301; 381/77; 381/182; 381/333; 381/335; 381/336; 381/351; 181/145; 181/147; 181/153

(58) Field of Classification Search .................... 381/77, 381/182, 332, 333, 335, 336, 351, 385, 301; 181/145, 147, 153; 348/738
See application file for complete search history.

(56) References Cited

U.S. PATENT DOCUMENTS

| | | | | |
|---|---|---|---|---|
| 3,135,348 | A * | 6/1964 | Bill | 181/147 |
| 3,308,237 | A * | 3/1967 | Novak | 381/98 |
| 4,169,516 | A * | 10/1979 | Honda | 181/153 |
| 4,223,760 | A * | 9/1980 | LeTourneau | 181/147 |
| 4,940,108 | A * | 7/1990 | Selby | 181/145 |
| 5,751,821 | A * | 5/1998 | Smith | 381/332 |
| 6,633,648 | B1 * | 10/2003 | Bauck | 381/303 |
| 6,643,379 | B1 * | 11/2003 | Onglao | 381/351 |
| 7,130,430 | B2 * | 10/2006 | Milsap | 381/77 |
| 7,548,630 | B2 * | 6/2009 | Schlenker et al. | 381/385 |
| 2003/0185404 | A1 * | 10/2003 | Milsap | 381/77 |
| 2006/0126878 | A1 * | 6/2006 | Takumai et al. | 381/335 |

FOREIGN PATENT DOCUMENTS

| | | | |
|---|---|---|---|
| JP | 2003-290686 | * | 8/2003 |
| JP | 2005064746 A | * | 3/2005 |

* cited by examiner

*Primary Examiner* — Devona Faulk
(74) *Attorney, Agent, or Firm* — Wayne Edward Ramage; Baker Donelson

(57) ABSTRACT

A speaker system which includes a housing and a linear array of a plurality of sound-generating transducers. A housing is in the form of a cylinder having a longitudinal axis and substantially circular cross-section. The linear array of sound-generating transducers are mounted upon a substantially planar chord configured within a sidewall of the cylinder.

8 Claims, 7 Drawing Sheets

SPEAKER SYSTEM

This application is a continuation in part of U.S. application Ser. No. 10/418,666 filed on Aug. 4, 2003 now abandoned which is, in turn, a continuation in part of U.S. application Ser. No. 09/478,319 filed Jan. 6, 2000, now U.S. Pat. No. 6,628,793.

TECHNICAL FIELD

The present invention is directed toward improved loudspeaker systems having line arrays of transducers. Through the selection of described cabinet geometrics and transducer placement, superior sonic characteristics can be achieved over prior art designs.

BACKGROUND OF THE INVENTION

The present invention involves the reproduction of sound, typically voice and music, in an enclosed space. Systems such as the type disclosed herein have been adopted by music lovers for the reproduction of stereophonic high fidelity sources either in the form of two channel audio or multi channel audio-video home entertainment systems.

As noted above, applicant has previously filed applications directed to loudspeaker systems of the type disclosed and claimed herein. These generally involve arrays of individual loudspeakers or transducers in one or more straight-line arrangements, so-called line-arrays. It was the domain of the previously filed applications to teach the use of a multitude of drivers or transducers in an organized way to eliminate the normally encountered limitations of frequency selective dispersion of sound and to improve the dynamic range of such loudspeakers intended for residential use.

To further characterize applicant's prior applications, transducers were taught as being configured into vertical lines on a face of a tall, slim cabinet. Ideally, two vertical arrays in each cabinet were employed, one consisting of mid-range drivers and the other consisting of high-frequency drivers, commonly referred to as tweeters, parallel thereto. In a typical 2-channel system, the cabinets are used in pairs with the lines of drivers arranged in mirror-image such that the tweeter lines are physically placed toward the center of the listening space with the mid-range drivers on the outside of that space. Obviously, these speakers could also include a line array in a horizontal orientation between the left and right-hand speakers in order to support a center channel placed proximate to a video display to create a home theater system.

Whether one employs speaker systems for 2-channel stereophonic reproduction or multi-channel home theater systems, there are advantages inherent in the use of line arrays of transducers rather than point source drivers common to the prior art. Point source transducers are oftentimes employed because it is relatively easy to measure the output of a point source. A measuring microphone is also an approximation to a geometric point. The principle reciprocity makes it easier to measure a point with a point. However, this has virtually no relevance to the way humans hear music.

Although line arrays are difficult to measure, and when measured in conventional ways, yields results which may be difficult to interpret, there are certainly advantages in reproducing music using line arrays of transducers. Measuring difficulties are expected from the placement of mid-range and tweeter line arrays side-by-side which can cause aberrations of dispersion of sound, known as polar errors, in the horizontal plane in the cross-over region where both lines are operating. However, it has been observed that this does not occur. This expectation arises from point-source thinking; that is, if the line is viewed in horizontal cross-section, it appears to be two point sources side-by-side. Such a configuration would indeed produce horizontal polar errors. But line arrays cannot be analyzed in this manner because it would only be valid for the plane of the cross-section. The sources are physically extensive in the vertical direction and any movement out of the plane of the cross-section mentioned above yields a different polar summation. In fact, it is not possible to physically observe only the plane of the cross-section as a plane is a mathematical abstraction. Any spatial averaging in the observation causes the expected polar aberrations to be unobservable. Looked at differently, in normal human hearing, there are three mechanisms of spatial averaging. First, observers have two ears which are separated from each other in space. Second, ears collect sounds over the area of the outer ear which is not a point. Third, when one listens to an audio system, his or her head continually makes small movements which continually reposition the ears in space. As such, in human hearing, there is both static and dynamic spatial averaging occurring simultaneously and continuously.

It is also noted that point source transducers radiate a spherical wave, that is, one which is isotropic whereas a line source radiates a cylindrical wave, that is, the wave is anisotropic. The sound pressure from a point source decreases as the square of the distance from the transducer where the sound pressure for a line source decreases linearly with distance. This can be explained by noting that the area of a spheric surface is proportional to its radius squared, while the area of a cylinder is proportional to its radius. From a practical standpoint, this is significant for in stereophonic listening from point sources, it is important to listen precisely in the middle, or equal distance between the two loudspeakers because the square law sound pressure relationship means that if the listener moves off center, the central auditory image is affected by a square of the distance providing the listener with a sense that he or she has "fallen into" the nearer loudspeaker. With a line array speaker system, this effect is reduced by an order of magnitude resulting in a much larger usable listening area.

Yet a further advantage in employing a line array of transducers in a speaker system involves the "aperture" of the line or in other words, the height of the cylindrical wave. This height is approximately equal to the physical length of the line array. In a typical residential listening environment, this means that reflections from the ceiling are minimized. This is important because overhead reflections can cause auditory backward inhibition in normal human hearing. This prevents a sense of "envelopment" in the reproduced sound. By reducing the cause of auditory backward inhibition, line arrays are able to produce a much more involving psychoacoustic effect. By contrast, a point source is a relatively small creator of acoustic energy which disperses sound waves broadly. As such, the line array is the only direct radiator configuration which can simultaneously limit dispersion in one direction (vertical) while maximizing it in another (horizontal). However, this can only be achieved if the entire structure can be made narrow, the geometry of such a structure being a cornerstone of the present invention.

It is thus an object of the present invention to provide a speaker system possessing a linear array of transducers which optimizes the interaction between the loudspeaker, the room and one or more listeners.

This and further objects will be more readily apparent when considering the following disclosure and appended drawings.

SUMMARY OF THE INVENTION

The present invention is directed to a speaker system comprising a housing and a linear array of a plurality of sound generating transducers. The housing comprises a cylinder having a longitudinal axis and substantially circular cross-section, the linear array of sound generating transducers being mounted upon a substantially planar chord configured within a sidewall of said cylinder.

DETAILED DESCRIPTION OF THE INVENTION

Figure 1:
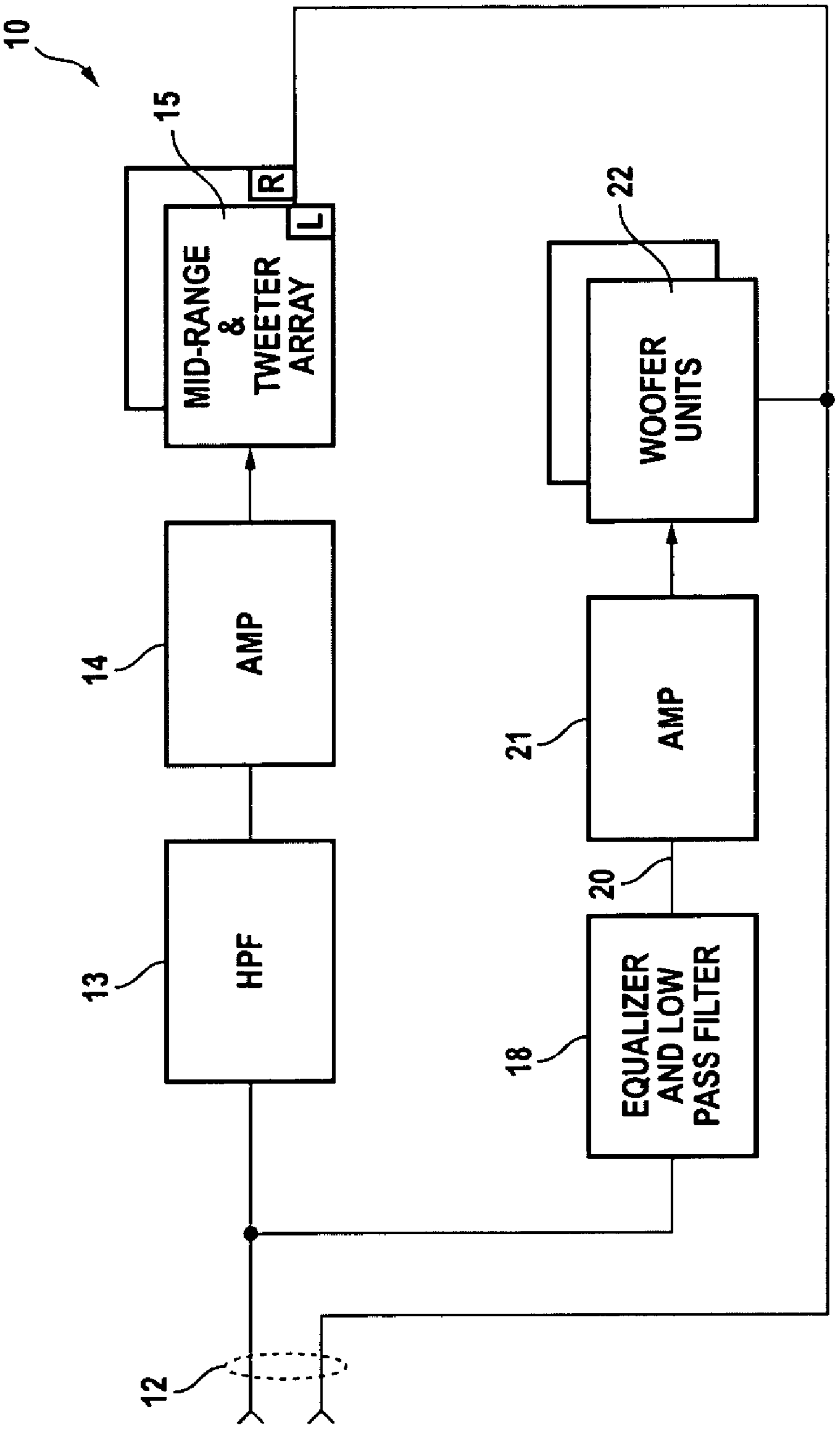
FIG. 1 is a functional illustration of a speaker system.

As was the case of the parent U.S. Pat. No. 6,628,793, the disclosure of which is incorporated by reference herein, the present invention involves line arrays of mid-range transducers and high-frequency or tweeter transducers. FIG. 1 is a functional illustration of such a speaker system 10.

Speaker system 10 includes an input 12 that receives an input signal from a source, such as a stereo receiver, CD player, turntable or the like. The input signal is routed along two paths. The first path includes a high pass filter 13 such as a series connected capacitor that provides a high pass signal to an amplifier 14, which provides an amplified signal to a plurality of mid-range/tweeter arrays 15. The second path includes an equalizer circuit 18 that provides an equalized signal on a line 20 to an amplifier 21, which provides a low frequency amplified signal to woofer units 22.

As noted previously, it is a prime goal in the present invention to provide a speaker system demonstrating reduced acoustic diffraction of a line array of drivers or transducers. As background, it has been observed that diffraction around an obstacle is different for different frequencies. In a loudspeaker system, the emissions from the diaphragm(s) are heard directly and by reflection from room surfaces. Much of the sound which excites the reflections is first diffracted by the enclosure in which the loudspeaker driver units are mounted. Geometric shapes with no edges have the smoothest diffraction characteristics, that is, they modify the diffracted sound less than shapes which have edges. Such edge-free shapes include the sphere, the ovoid and the cylinder. Of these shapes, the cylinder is well suited to accommodate a line array of transducers.

Figure 2:
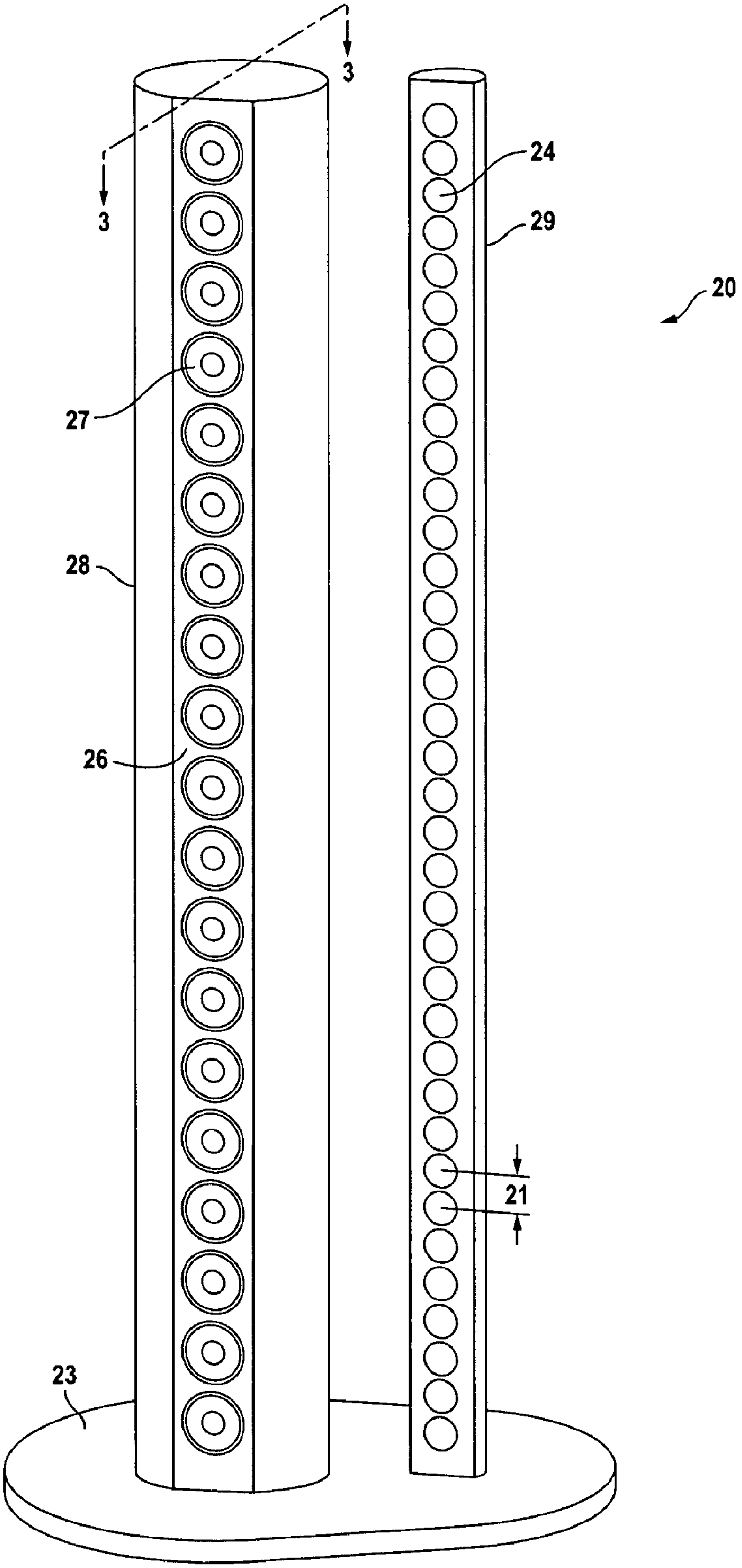
FIG. 2 is a perspective view of a physical embodiment typifying the present invention.

In this regard, reference is made to FIG. 2 showing the left hand speaker of a two channel system produced pursuant to the present invention. As noted, mid-range transducers 27 are housed within cylinder 28. However, cylinder 28, in and of itself, is not well suited to accommodate a line array. A purely cylindrical shape does not permit mounting a loudspeaker drive unit with a flat chassis. It is necessary, therefore, to cut a chord 26 off the cross-section of cylinder 28 to facilitate flat regions of mid-range transducers 27. With such a geometry, however, placing chord 26 on a surface of cylinder 28 provides an oblique angle which satisfies the need to significantly reduce diffracted sound from the cylindrical column.

Figure 3A:
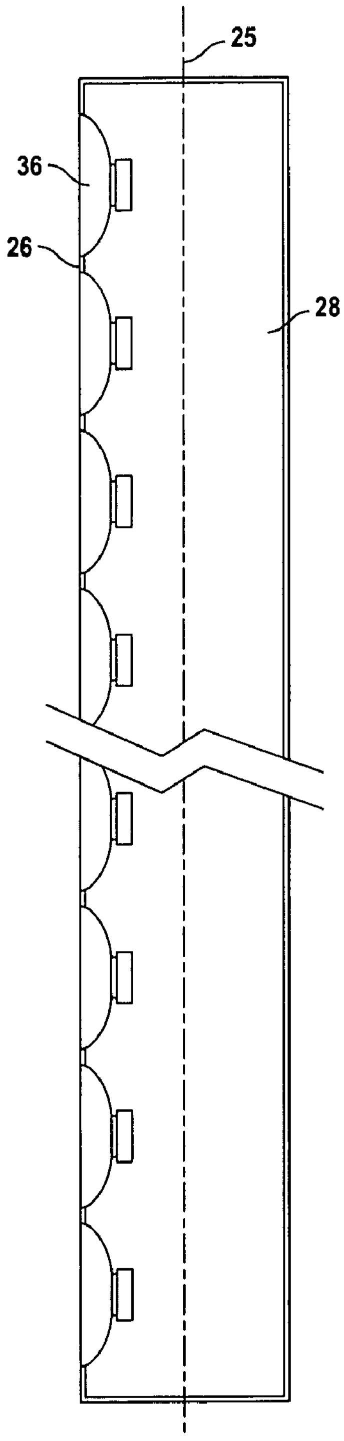
FIGS. 3*a* and 3*b* are cross-sectional views of a line taken along by sector 3-3 of FIG. 2, illustrating two preferred embodiments of the present invention.
Figure 3B:
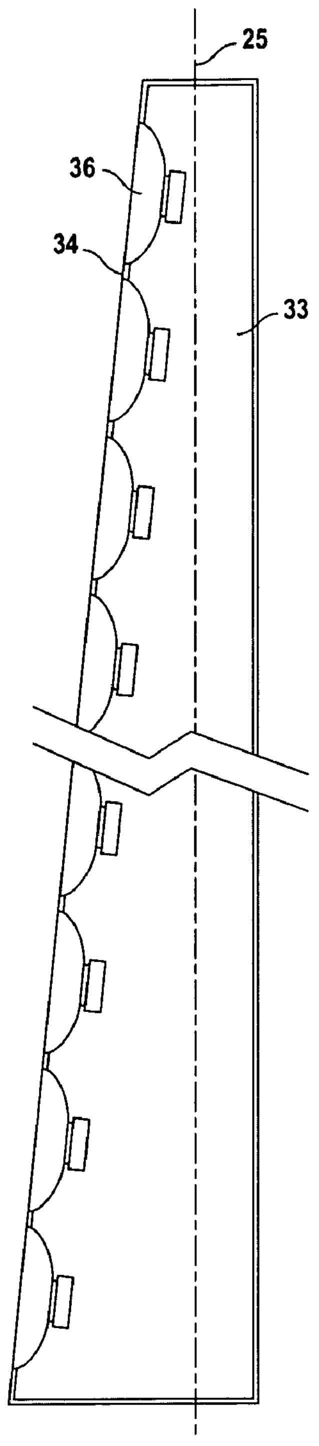

It is noted with regard to the speaker system 20 of FIG. 2 that chord 26 need not necessarily be parallel to longitudinal axis 25 of cylindrical cabinet 28. In this regard, reference is made to FIGS. 3*a* and 3*b*. In FIG. 3*a*, chord 28 is parallel to longitudinal axis 25. However, in FIG. 3*b*, chord 34 is tilted with respect to longitudinal axis 25. Tilting chord 34 as shown in FIG. 3*b*, can be advantageous in spectrally spreading any residual edge diffractions where chord 34 meets the curved surface of cylinder 33.

As a further improved embodiment, it is proposed that base 23 of speaker system 20 support not only cylindrical mid-range transducer cabinet 28 but also, separately, column 29 housing a plurality of high-frequency transducers 24. As an example, each high-frequency transducer 24 can consist of 25 mm dome tweeters with compact neodymium motor structures which can be installed within cylinder 29. Cylinder 29 can be, for example, a solid rod of machinable polymer material into which wells are machined of sufficient depth to mount the transducers.

Figure 4:
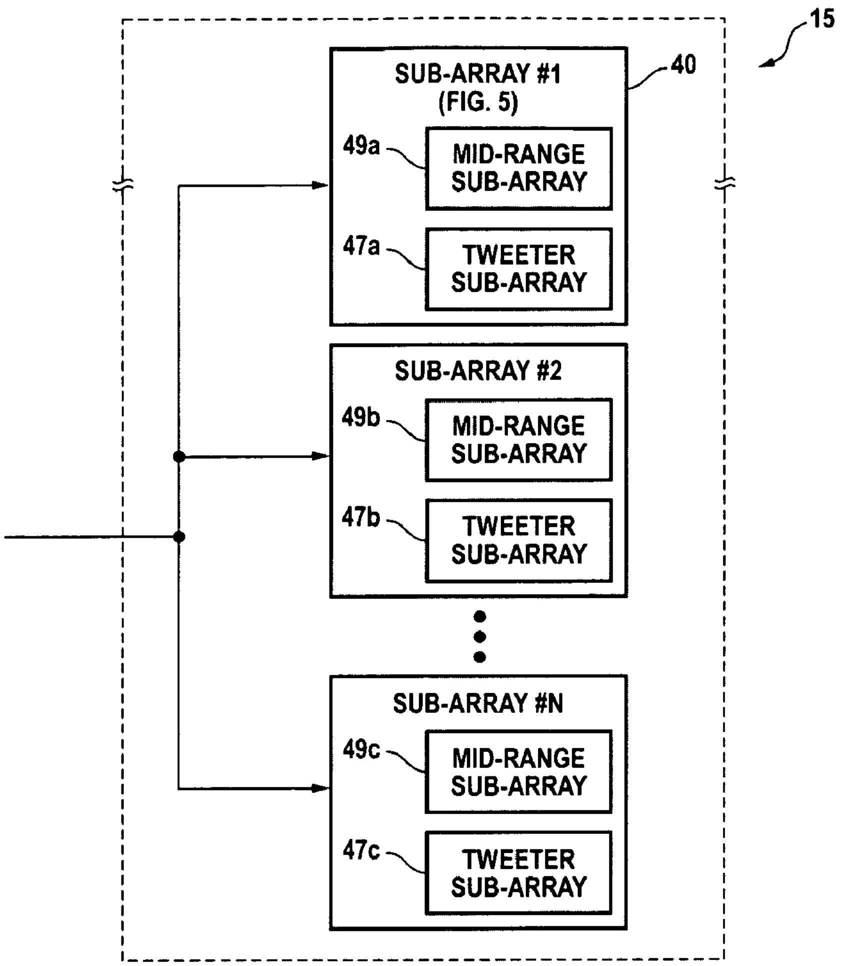
FIG. 4 is a functional block diagram illustration of the mid-range and tweeter arrangement within a typical mid-range-tweeter array representing a preferred embodiment of the present invention.
Figure 5:
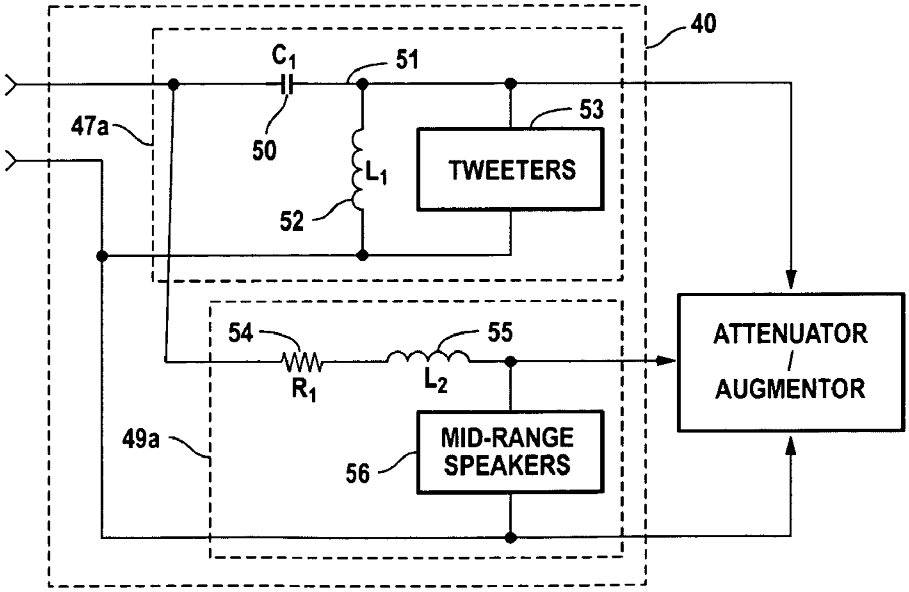
FIG. 5 is a schematic illustration of the mid-range-tweeter array of FIG. 4.

FIGS. 4 and 5 are schematic illustrations of a mid-range/tweeter sub-array 40 for use in the loudspeaker system of the present invention. The signal input to the sub-array 40 is routed to both the tweeter sub-array 47*a* and the mid-range sub-array 49*a*. The tweeter sub-array 47*a* includes a capacitor $C_1$ 50 that attenuates low frequency signal components to provide a high-pass signal on a line 51. An inductor $L_1$ 52 is located in parallel with a plurality of series connected tweeters 53. The mid-range sub-array 49*a* includes a resistor $R_1$ 54, an inductor $L_1$ 55 and a plurality of series connected mid-range drivers 56. Significantly, this arrangement provides multiple electrically parallel sub-arrays, wherein each of the speakers within a sub-array are electrically in series. The details regarding the characteristics and number of speakers within a sub-array shall now be discussed.

Referring once again to FIG. 5, the tweeters within the tweeter sub-array 53 are selected primarily based upon their bandwidth and aperture size. Generally, multiple tweeters are mounted adjacent to each mid-range. The tweeters are also arranged in a series/parallel configuration. For example, in one embodiment a plurality of tweeters (e.g. six) are connected electrically in parallel to the other tweeter sub-arrays. One of ordinary skill will recognize that various series/parallel combinations of the tweeters is possible.

Returning once again to the loudspeaker cabinet geometry, it has been suggested that the mid-range transducers be mounted upon a flat chord cut within the sidewall of a cylindrical housing presenting an oblique angle between the chord and housing at their interface. In doing so, the internal cabinet wall diametrically opposite the transducers is in the form of a curved concave surface. Unfortunately, concaved surfaces of appropriate dimensions produce strongly focused reflections. In a loudspeaker system, this is not desired as an acoustic wave from the transducers supported by the chord will be reflected back to the transducer cones producing undesirable modification of the sound quality emanating from the speaker system. There are several ways to deal with this matter in producing a speaker system according to the present invention.

A first way to reduce back waves from the interior surface of cylindrical housing 28 is to provide a bisector blade. Such an expedient was disclosed in parent U.S. Pat. No. 6,628,793 as element 80 of FIG. 6. Again, the disclosure in this regard has been incorporated by reference herein. By using such a blade, the reflection of acoustic waves is eliminated by redirecting those waves away from the back of the transducer cones. Other structures capable of significantly dispersing reflection are suggested herein. In this regard, reference is made to FIGS. 6*a* and 6*b*.

Figure 6A:
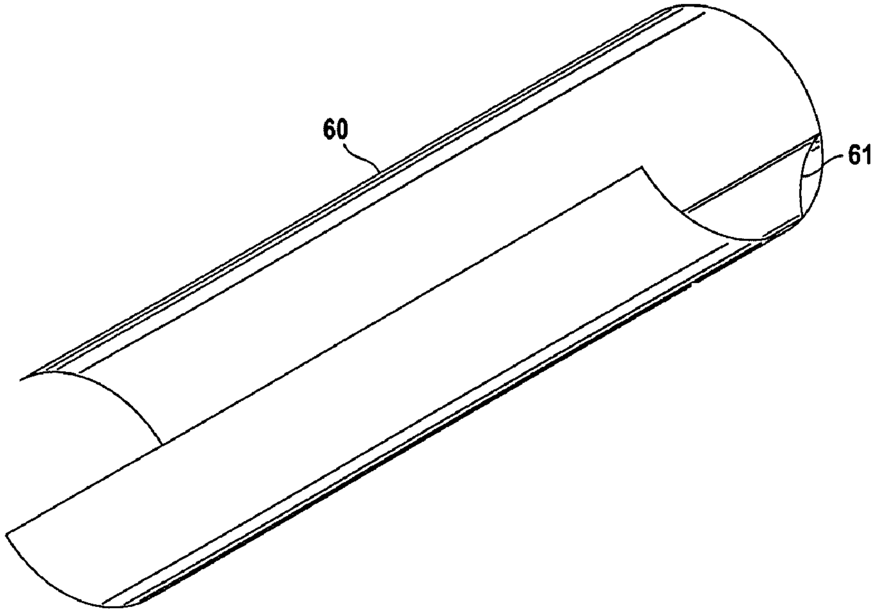
FIGS. 6*a* and 6*b* are two embodiments of a cut away portion of a cylinder useful in supporting at least the mid-range linear array of transducers of the speaker system of the present invention.
Figure 6B:
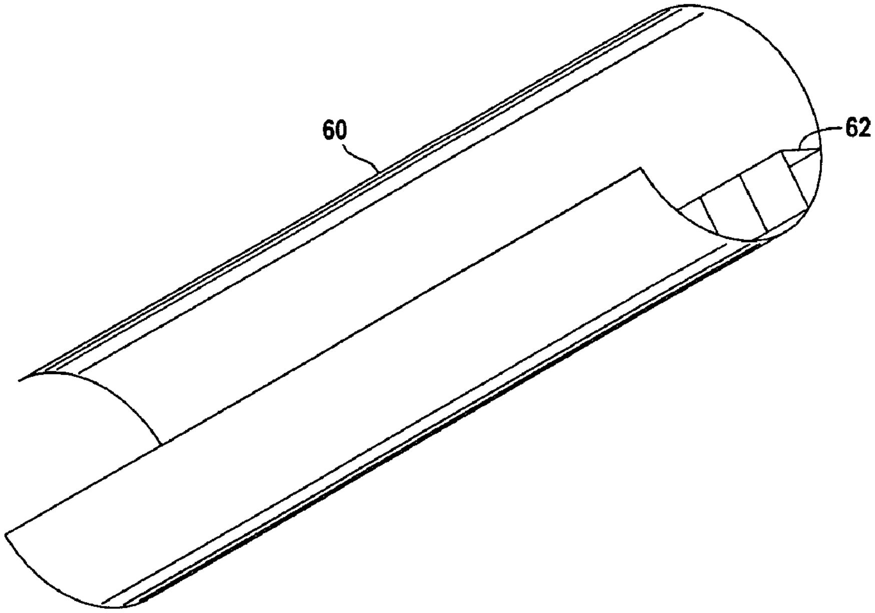

Turning first to FIG. 6*a*, partial cylinder 60 is shown upon which a suitable chord and appended transducers would be applied. One suitable structure would include hemi-cylinder 61 applied to the interior concave surface of partial cylinder 60 parallel to axis 25 of the cylindrical member. Such a structure would virtually completely eliminate any focused reflection by diffusion. Another suitable structure is shown in FIG. 6*b* where partial cylinder 60 supports one or more L-shaped metal angle iron inserts again arranged parallel to axis 25 of cylindrical member 60 with the tip of the cross-section of the L-shaped metal angle iron pieces pointing into the enclosure as shown. This also creates diffusion which eliminates focused reflection.

Referring once again to FIG. 2, a comparison should be made between that structure and the speaker system made the subject of parent U.S. Pat. No. 6,628,793. In the '793 patent, the mid-range and tweeter transducers are housed in a single cabinet. It is now been determined that separating mid-range and tweeter transducers 27 and 24, respectively, provides advantages in minimizing refraction. Although not being bound by any particular theory of operation, it is suggested that the proximity of mid-range cones and frames create a local acoustical environment in which unwanted diffraction and reflection of the tweeter radiation can occur. Therefore, when both mid-range and tweeter transducer lines are on the same panel, such as chord 26, the advantages of the cylindrical enclosure are not fully exploited.

In further maximizing the present design parameters, additional benefits can be realized by moving adjacent tweeters 24 as close to one another as possible, thus minimizing the distance 21 (FIG. 2). By physically separating the lines and enclosing each in separate cylinders which, themselves, are as small as possible enables one to maximize the benefits the present design.

As noted with regard to the present discussion of FIGS. 1, 4 and 5, it was suggested that certain electrical relationships be established between groups of mid-range and tweeter transducers. Further, parent U.S. Pat. No. 6,628,793 suggests that the line array of transducers be established such that two high-frequency transducers would be employed for every one mid-range transducer in an appropriate speaker system.

It has now been determined that superior results can be achieved not by establishing a specific ratio of high-frequency to mid-range transducers, but, instead, by employing small high-frequency radiators and by packing them as close as possible along cylinder 29. It was noted when two lines of radiators, such as a mid-range line and a tweeter line are placed vertically and parallel to each other, the resulting summation in the horizontal plane cannot be predicted by a horizontal cross-section assumption of two point sources. Such an analysis might have meaning for any infinitesimally thin horizontal slice of the space surrounding the lines but any vertical averaging whatsoever will fill the nulls and diminish the lobes predicted by simple planar analysis. When two line arrays such as a mid-range line and a tweeter line are placed parallel to each other, it is desirable that the spacing dimensions not be spatial harmonic. That is to say, that the interval 21 between tweeters 24 not be integrally related to the interval between mid-ranges. This accomplishes two objectives. First, it allows the smaller drivers or tweeters to be mounted as close to one another as possible and to be more numerous for a given line length and, second, it causes even the simple planar analysis of the horizontal plane summation to be different for every elevation along the lines, thereby enhancing the spatial averaging discussed above. It is noteworthy that such spatial averaging inherently occurs in binaural hearing as well as with any acoustic normal reverberation.

Figure 7:
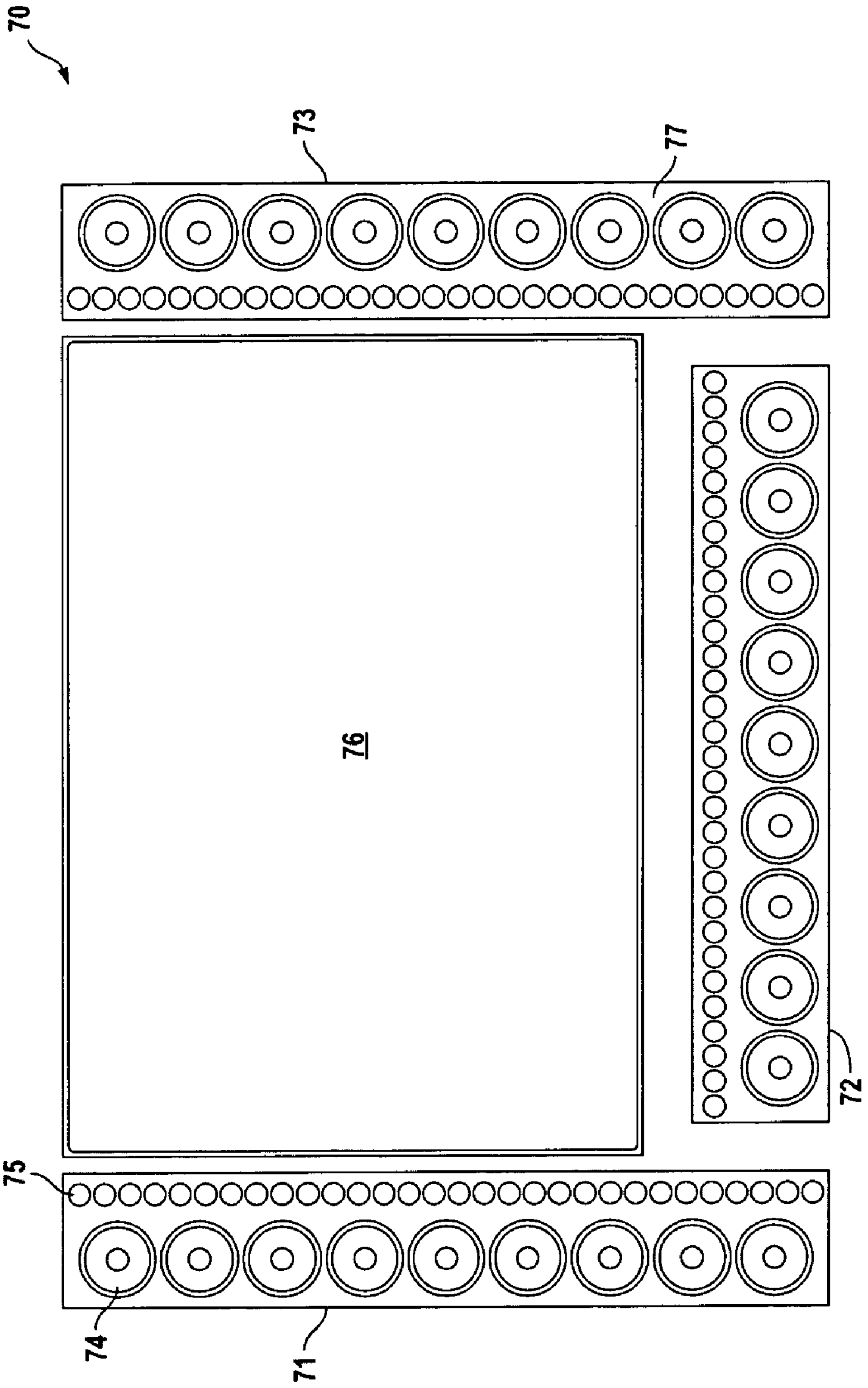
FIG. 7 is a front plane view of an audio-video home theater installation employing the speaker systems of the present invention.

As a further embodiment, reference is made to FIG. 7 showing the use of the present speaker system in a home theater environment in conjunction with a video or other visual display. Video display 76 could be an LCD, DLP, CRT or a screen to be projected upon, either from the front or rear. FIG. 7 displays the left, center and right speaker channels of a 5.1 channel audio system. The surround channels, not shown, can advantageously employ line arrays as well, but such is outside the scope of the present invention.

Further, the present application as shown in FIG. 7 is not limited to a 5.1 channel cinema system as is predominately practiced at this time. The other multi-channel techniques such as ambisonics, transaural and wave field techniques could benefit from this invention. System 70 which includes video display 76 is provided with speakers 71, 72 and 73. Each consists of line arrays in which mid-range and tweeter lines are mounted on a common front panel. Their surround enclosures can be cylindrical as discussed above or hemi-cylindrical to permit effective mounting upon a wall. An alternative embodiment would allow disaggregated arrays in which mid-range and tweeter lines are separately enclosed as described above. In other words, tweeter array 75 and mid-range array 74 could be contained within the same enclosure as shown or two separate enclosures could be provided similar to that shown in FIG. 2.

The benefits which accrue from providing system 70 are several. The constrained directivity in the long dimension which is inherent to a line source causes a performance advantage over typical point sources when mounted in a reflecting plane, such as a wall. This is due to the elimination of reflections in the long dimension of the array. A similar benefit is achieved on, as opposed to in, the wall when the mounting method effects a smooth transition from the plane of the drive units to the plane of the wall. A preferred embodiment would be a hemi-cylinder, but other embodiments could include other curved cross-sections or other geometric shapes, such as trapezoids.

In a normally configured multichannel front reproduction system, it is generally not possible to co-locate the center channel loudspeaker and the screen. The usual solution is to place the center loudspeaker above or below the screen. With multi-way point source loudspeaker systems, this moves the frequency-dependent polar response variations into the horizontal plane, because the speaker has to be placed sideways above or below the video screen. The resulting horizontal-angle variations of the frequency response cause changes in timbre depending on where the listener is seated across the available viewing space. The widely used so called d'Appolitto or mid-range-tweeter-mid-range configuration especially suffers from this problem in a horizontal orientation. Further, with point source loudspeakers in the front-left and front-right positions, the sound pressure varies as the square of the distance between the listener and a particular loudspeaker. The cumulative result of these deficiencies is that different seating positions provide very dissimilar auditory images to the various listeners/viewers.

The deficiencies described above are all simultaneously addressed by the use of line arrays for all three front channels. The horizontal line array for the center channel has no polar aberrations within its aperture, which, in practice, is somewhat wider than the width of the horizontal line array. The vertical line arrays in the left and right channels exhibit the well-known property of line-arrays that the sound pressure falls linearly with distance rather than as the square of the distance as with a point source. The result is that as a listener moves across the sound stage, the image does not tend to "fall into" the near speaker. This stabilizes the lateral image, and combined with the invariant coverage of the horizontal line for the center channel produces a very reliable auditory image for all practical listener/viewer positions.

In the preferred embodiment of system 70, three identical line arrays 71, 72 and 73 are used in conjunction with large video display 76 such as a plasma display or a front or rear projection screen. FIG. 7 shows three such line arrays of the combined mid-range tweeter type grouped around display screen 76. It will be seen that line arrays 71, 72 and 73 are identical in composition, even though they are used in three different positions. As illustrated, separate arrays are used, but there is nothing to preclude incorporating them into a single piece of furniture. In an alternative embodiment, and given a flat screen display, the arrays can be mounted directly on the wall along with the display or they can be recessed into the wall.

Figure 8:
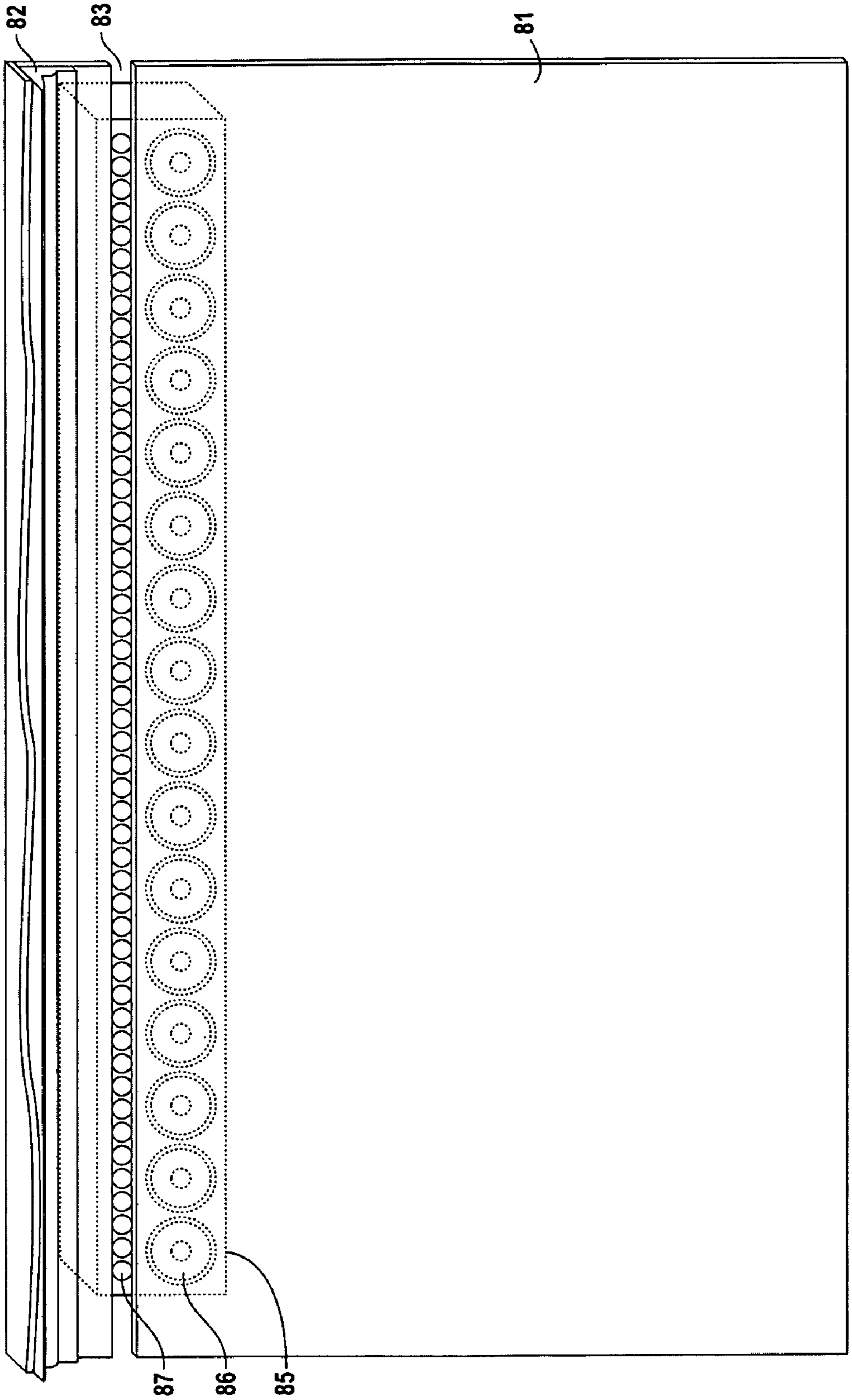
FIG. 8 depicts another suggested use of the speaker system of the present invention in a home environment, in this instance, being an in-wall molding application.

To provide musical content to a home environment unobtrusively, the present speaker system could be integrated into architectural millwork that would obscure the visual pact of the system but allow its sonic attributes to be enjoyed. For example, reference is made to FIG. 8. In this regard, wall 81 is shown having crown molding 82 creating spacing 83 there between. A suitable array of mid-range transducers 86 and tweeter transducers 87 can be incorporated therein, these transducers being mounted in suitable cabinetry in the various embodiments discussed previously. Due to their directionality, it is suggested that tweeters 87 be located to fire directly from a position aligned with gap 83. When properly positioned, one could enjoy significant audio output throughout a residential room without even being aware of the speaker positioning behind wall 81. Again, in doing so, one is provided, due to the line source nature of the present speaker system acoustic output without polar aberrations. Walking about the room will tend to provide a more uniform and gratifying audio experience than could possibly be the case if the line arrays of mid-range transducers 86 and high-frequency transducers 87 were replaced by typical point source-based speaker systems.

Although the present invention as been shown and described with respect to several preferred embodiments thereof, various changes, omissions and additions to the form and detail thereof, may be made therein, without departing from the spirit and scope of the invention.

The invention claimed is:

1. An audio-video display system, comprising:

a video display screen; and at least three linear array sets of sound-generating transducers, each linear array set comprising three or more mid-range frequency transducers in a linear array and four or more high-frequency transducers in a linear array, wherein said linear array of mid-range frequency transducers is substantially parallel to and facing in the same direction as said linear array of high-frequency transducers of the same set, further wherein said high-frequency transducers are mounted adjacent to each other as closely as possible and the number of high-frequency transducers exceeds the number of mid-range frequency transducers in the same set; and further wherein a first and second of said linear array sets being positioned vertically to the left and right of said video display screen, respectively, and a third of said linear array sets being horizontally positioned below said video display screen.

2. The audio-video display system of claim 1 wherein said video display screen is mounted upon a vertically extending structural wall.

3. The audio-video display system of claim 2 wherein said at least three linear array sets of sound-generating transducers are positioned upon said vertically extending structural wall.

4. The audio-video display system of claim 2 wherein said at least three linear array sets of sound-generating transducers are flush mounted to said vertically extending structural wall.

5. The audio-video display system of claim 1 wherein each linear array set of sound-generating transducers is supported by a housing.

6. The audio-video display system of claim 5 wherein each housing is substantially cylindrical with a substantially planar chord configured within a side wall of said cylindrical housing for supporting said sound-generating transducers.

7. The audio-video display of claim 5 wherein sets of linear arrays of mid-range frequency transducers and high-frequency transducers are contained within separate housings.

8. The audio-video display of claim 1 wherein said video display screen is substantially rectangular having a length and height and wherein said vertically extending linear arrays are of approximate dimension of said height and said horizontally extending linear array is of an approximate dimension of said width of said video display screen.

* * * * *